(12) United States Patent
Tseng

(10) Patent No.: US 6,589,840 B2
(45) Date of Patent: Jul. 8, 2003

(54) NONVOLATILE MEMORY DEVICE WITH REDUCED FLOATING GATE AND INCREASED COUPLING RATIO AND MANUFACTURING METHOD THEREOF

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/891,408

(22) Filed: Jun. 27, 2001

(65) Prior Publication Data
US 2003/0006475 A1 Jan. 9, 2003

(51) Int. Cl.[7] .............................................. H01L 21/336
(52) U.S. Cl. ........................................ 438/257; 438/266
(58) Field of Search ................................. 438/201, 257, 438/259, 263, 264, 267, 266, 270, 296, 589, 593, 594, 680, 700, 745, 954

(56) References Cited

U.S. PATENT DOCUMENTS 6,013,551 A * 1/2000 Chen et al. ................. 438/264
6,084,265 A * 7/2000 Wu ............................. 257/332
6,171,909 B1 * 1/2001 Ding et al. .................. 438/267
6,355,524 B1 * 3/2002 Tuan et al. .................. 438/257

* cited by examiner

Primary Examiner—David Nelms
Assistant Examiner—David Nhu
(74) Attorney, Agent, or Firm—Intellectual Property Solutions, Incorporated

(57) ABSTRACT

A nonvolatile memory device with a reduced size floating gate and an increased coupling ratio is disclosed. The nonvolatile memory device includes two isolation structures protruding above a semiconductor substrate. Two dielectric spacers are disposed on a pair of opposing sidewalls of the two isolation structures. The two dielectric spacers are spaced from one another at a distance that defines a gate width which is beyond lithography limit. A tunnel dielectric and a floating gate are provided on substrate and confined between the two dielectric spacers. The floating gate has a smaller bottom surface area relative to its top surface area and has a surface substantially coplanar with a surface of the isolation structures. On the coplanar surface, an inter-gate dielectric and a control gate are provided. Optionally, a lightly doped region is provided beside the floating gate 118 and within the substrate. A manufacturing method for forming such memory device is also disclosed.

20 Claims, 3 Drawing Sheets

NONVOLATILE MEMORY DEVICE WITH REDUCED FLOATING GATE AND INCREASED COUPLING RATIO AND MANUFACTURING METHOD THEREOF

BACKGROUND OF THE INVENTION

1. Field of the Invention

The present invention generally relates to a nonvolatile semiconductor memory device such as an EPROM (erasable programmable read only memory), EEPROM (electrically erasable programmable read only memory) and a flash memory. The present invention also relates to a method of manufacturing such a nonvolatile semiconductor memory device.

2. Description of the Related Arts

High-density nonvolatile memory devices have been receiving much attention for application in many fields. One of the most important factors is the low cost of the reduced size of each memory cell. However, it is very difficult to shrink the cell size in the fabrication of nonvolatile memory cells when the conventional local oxidation (LOCOS) isolation technique is used. The isolation structure formed by this technique has a very large dimension and thus limits the miniaturization of the memory cells.

Another isolation technique called shallow trench isolation (STI) has been introduced to the fabrication of non-volatile memory devices to reduce the cell size. The conventional field oxides are replaced by STI structures so that the device integration can be effectively improved. However, as component dimensions continue to shrink, the surface area of floating gates also shrinks. This leads directly to a decrease in capacitance of the effective capacitor formed between the floating gate layer and the control gate layer. This decrease in effective capacitance results in a reduction of the capacitive coupling ratio, which is a parameter that describes the coupling to floating gate of the voltage applied to control gate. The poorly-coupled voltage to floating gate limits the programming and accessing speed characteristics of the memory device.

The capacitive coupling ratio Cp is defined by:

$$Cp = \frac{Ccf}{Ccf + Cfs}$$

where Ccf is capacitance between the control gate and the floating gate; and Cfs is capacitance between the floating gate and the semiconductor substrate.

In order to gain programming and accessing speeds in nonvolatile memories, many attempts have been done to increase the coupling ratio. It can be understood from the above equation that when the capacitance Ccf between the control gate and the floating gate increases, the coupling ratio Cp increases. Therefore, the coupling ratio Cp is generally increased by increasing the capacitor area between the floating gate and control gate, which increases the capacitance Ccf, and therefore the coupling ratio Cp. For example, U.S. Pat. No. 6,171,909 discloses a method for forming a stacked gate of a flash memory cell. The coupling ratio of the stacked gate is increased by forming a conductive spacer. The conductive spacer, which is a portion of the floating gate, increases the capacitor area between the floating gate and control gate.

In the present invention, a nonvolatile semiconductor memory device with an increased coupling ratio is disclosed. This is accomplished by providing a reduced size floating gate which reduces the capacitance Cfs between the floating gate and the semiconductor substrate. The effect is the same as increasing the capacitance Ccf between the control gate and the floating gate.

SUMMARY OF THE INVENTION

An object of the invention is to provide a nonvolatile semiconductor memory device having an increased capacitive coupling ratio.

Another object of the invention is to provide a nonvolatile semiconductor memory device having an reduced size floating gate with a gate width beyond lithography limit.

A further object of the invention is to provide a method for forming a nonvolatile semiconductor memory device having an increased capacitive coupling ratio.

A yet further object of the invention is to provide a method for forming a nonvolatile semiconductor memory device having an reduced size floating gate with a gate width beyond lithography limit.

An important feature of the invention is to provide two dielectric spacers on a pair of opposing sidewalls of "RAISED" isolation structures that protrude over a substrate. The dielectric spacers effectively decrease the dimension of the floating gate as well as the floating gate width. This reduces the capacitance Cfs between the floating gate and the semiconductor substrate, and therefore, increases the capacitive coupling ratio.

According to an aspect of the invention, there is provided a nonvolatile memory device including two isolation structures protruding above a substrate; two dielectric spacers disposed on a pair of opposing sidewalls of the two isolation structures; a tunnel dielectric and a floating gate provided on the substrate and confined between the two dielectric spacers; and a control gate electrode formed on the floating gate with an inter-gate dielectric interposed therebetween.

According to another aspect of the invention, there is provided a nonvolatile memory device including two isolation structures protruding above a substrate; two dielectric spacers disposed on a pair of opposing sidewalls of the two isolation structures, the two dielectric spacers being spaced from one another at a distance that defines a gate width therebetween; a tunnel dielectric and a floating gate provided on the substrate and confined between the two dielectric spacers, the floating gate having a surface substantially coplanar with a surface of the isolation structures; and an inter-gate dielectric and a control gate formed on the coplanar surfaces of the floating gate and the isolation structures.

According a further aspect of the invention, there is provided a method for forming a nonvolatile memory device comprising the steps of forming two isolation structures protruding above a substrate; forming two dielectric spacers on a pair of opposing sidewalls of the two isolation structures; forming a tunnel dielectric layer and a floating gate layer on the substrate and confined between the two dielectric spacers on the substrate; and sequentially forming an inter-gate dielectric layer and a control gate layer over said substrate.

According a yet further aspect of the invention, there is provided a method for forming a nonvolatile memory device comprising the steps of forming a mask layer on a semiconductor substrate; patterning the mask layer and the substrate to form trenches in the substrate; filling the trenches with isolation oxides that protrude above the substrate; removing the mask layer to leave a gate opening in between the isolation oxides; forming two dielectric spacers on a pair of opposing sidewalls of the isolation oxides, the two dielectric spacers being spaced from one another at a distance that defines a gate width therebetween; forming a tunnel dielectric layer on the substrate and between the two dielectric spacers; forming a floating gate layer on the tunnel dielectric layer and completely filling the gate opening; planarizing the floating gate layer to form a surface substantially coplanar with a surface of the isolation structures; and sequentially forming an inter-gate dielectric layer and a control gate layer on the coplanar surfaces of the floating gate and the two isolation structures.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENTS

Figure 1:
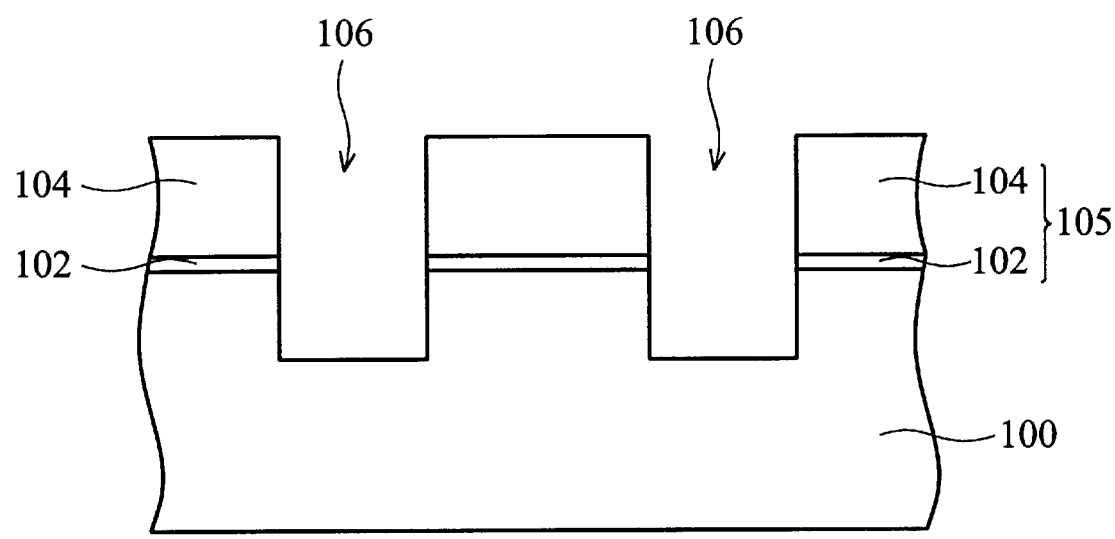
FIGS. 1–6 are cross-sectional views illustrating the steps for fabricating a nonvolatile memory device according to a preferred embodiment of the invention.

There will now be described an embodiment of this invention with reference to the accompanying drawings. FIG. 1 shows a semiconductor substrate 100 where trenches 106 are formed through a mask layer 105. The mask layer 105 preferably has a thickness between about 200 and 3500 Å, which can be a monolayer or stack dielectric layer. The mask layer 105 preferably includes a pad oxide layer 102 and a thick nitride layer 104 as shown. The pad oxide layer 102 can be formed by thermal oxidation or by an atmospheric or low pressure chemical vapor deposition (LPCVD) process as is well known. The silicon nitride layer 104 is usually formed by reacting dichlorosilane ($SiCl_2H_2$) with ammonia ($NH_3$) through an LPCVD process. The nitride layer 104 and the pad oxide layer 102 are then dry etched using a photoresist pattern as an etching mask which protects all areas on which active devices will later be formed. The etching is further carried into the substrate 100 to form shallow trenches 106 with a predetermined depth. The photoresist pattern is removed after using it to define active regions.

Figure 2:
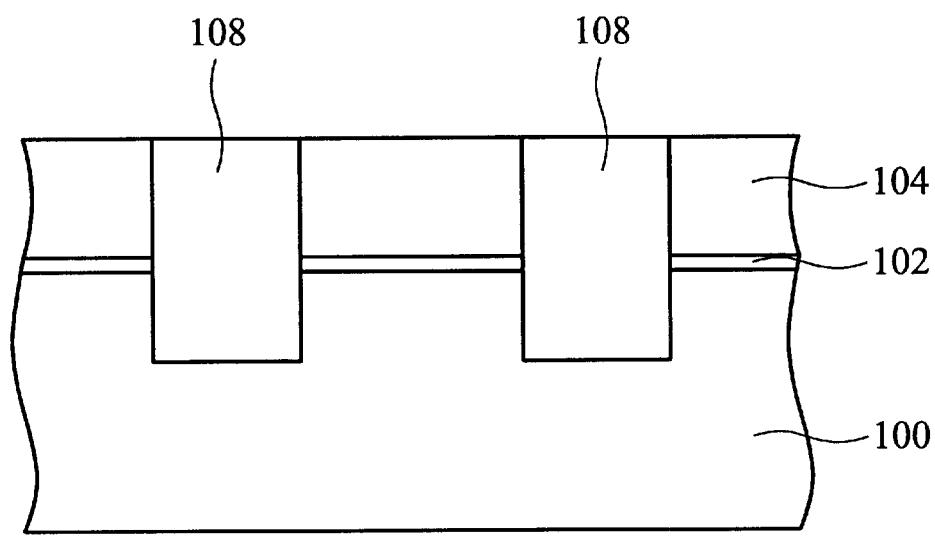

The inside walls of the trenches 106 are then lined with an oxide layer (not shown) by thermal growth. Subsequently, the trenches 106 are filled with isolation oxide using the method of high density plasma (HDP) deposition or LPCVD, thus forming "RAISED" shallow trench isolation (STI) 108 as shown in FIG. 2 Next, the substrate is subjected to chemical-mechanical polishing (CMP).

Figure 3:
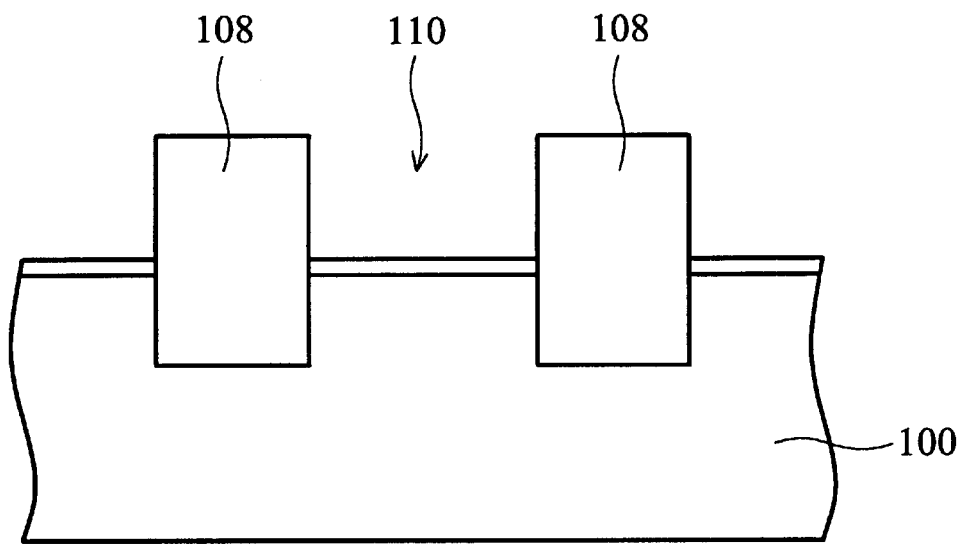

Referring to FIG. 3, the nitride layer 104 is removed, and a gate opening 110 is left behind. Nitride removal can be accomplished by using phosphoric acid ($H_3PO_4$). The removal of the nitride layer 104 leaves a gate opening 110 in between two isolation oxides 108 that protrude over the substrate 100. In the gate opening 110, the floating gate of the present invention will later be formed. The pad oxide layer 102 underlying the nitride layer 104 may also be removed by wet etch. However, it is more preferably in the present invention to preserve the pad oxide layer 102 until a dielectric spacer is later formed. The pad oxide layer 102 can serve as a protective layer of the underlying substrate as will become apparent below.

Figure 4:
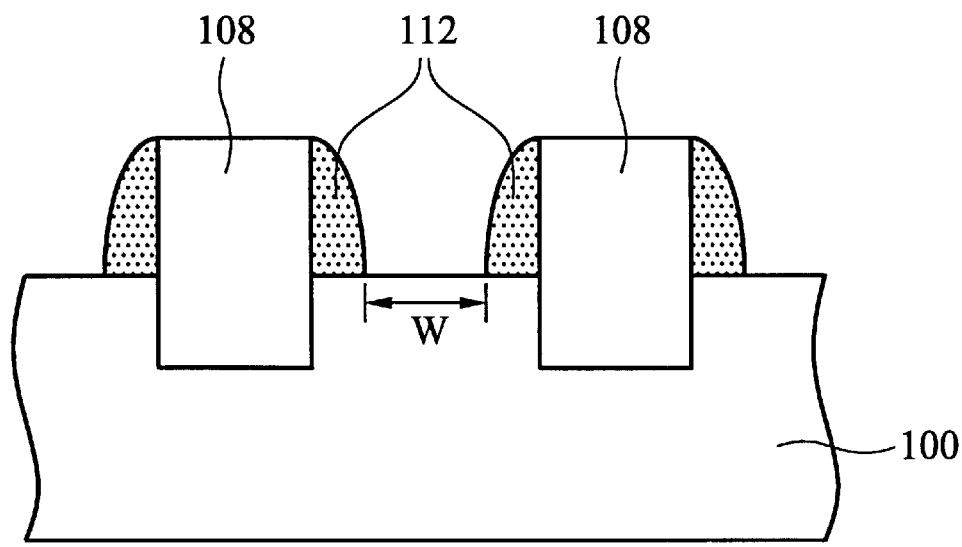

Referring to FIG. 4, as a main feature and a key aspect of the present invention, two dielectric spacers 112 are formed on opposing sidewalls of the isolation oxide 108. The dielectric spacers 112 reduce the dimension of the gate opening 110 and defines a gate width W therebeween that is smaller than can be directly fabricated by the design rule of fabrication equipment. The dielectric spacers can be formed by depositing a dielectric layer conformally over the substrate 100 and the isolation oxide 108, followed by anisotropically etching back. The pad oxide layer 102, if not removed, serves as a protective layer to prevent defects in the substrate 100 that may be generated during the etching for forming the dielectric spacers 112. The width of dielectric spacers is used to define the gate width W. The dielectric spacers 112 may have a width between about 100 to 2000 Å, depending on the dimension of the floating gate to be formed. The materials used to form the dielectric spacer may be silicon oxide or silicon nitride. As another key aspect of the present invention, the dielectric spacer is preferably formed of doped dielectric such as doped silicon nitride or doped silicon oxide. As will become apparent below, a lightly doped region will be formed during the subsequent thermal process if the spacers 112 are formed of doped dielectric.

Figure 5:
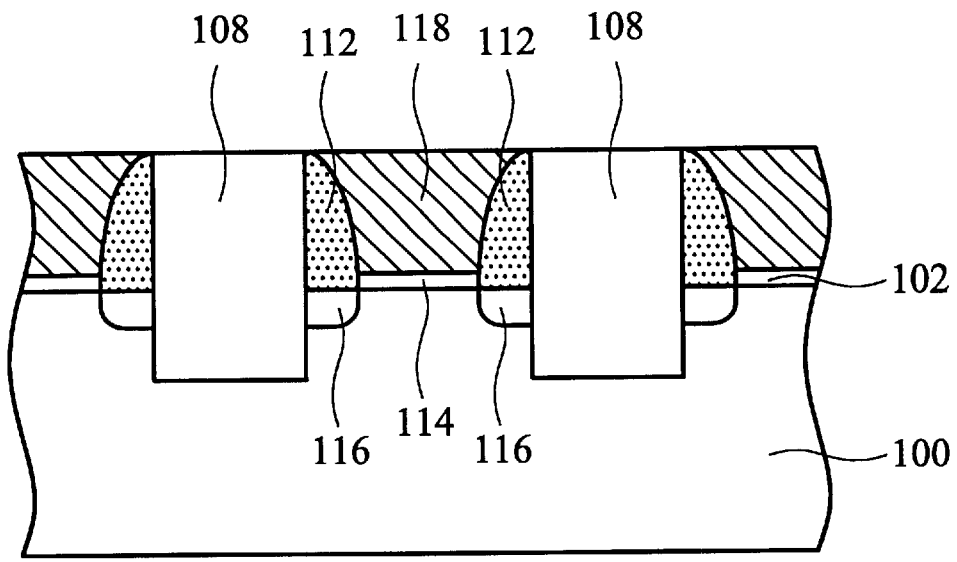

Next, the pad oxide layer 102, if any, is removed by wet etch. A tunnel dielectric 114 is formed between the sidewall spacers 112 as shown in FIG. 5. It is preferably formed by a thermal oxidation process at a temperature between about 750° C. to 950° C. The thermal oxidation concurrently creats a lightly doped region 116 in substrate beneath the doped spacers 112 due to diffusion of impurities from the doped spacer 112. The lightly doped region 116 prevents the memory device from non-gate channel inversion and improves the threshold voltage (Vt) stability. Alternatively, the tunnel dielectric 112 can be formed by an atmospheric or low pressure chemical vapor deposition (LPCVD) process as is well known.

Subsequently, a first conductive layer 118 of a thickness between 500 and 3500 Å is deposited as a blanket layer over the tunnel dielectric 114 and completely filing the gate opening 110. The first conductive layer is preferably formed of doped polysilicon, doped amorphous silicon, or metal. The blanket layer is then planarized by plasma etch or by chemical-mechanical polishing to the surface of the isolation oxide 108, resulting in a floating gate structure 118 confined between two isolation structures 108. This planarization also creates a coplanar surface of the floating gate 118 and the isolation oxides 108. As shown in FIG. 5, the dielectric spacers 112 create a smaller geometric area between the floating gate 118 and the semiconductor substrate 100, which reduces the capacitance between the floating gate and the substrate, and therefore increases the capacitive coupling ratio. The floating gate width which is beyond lithography limit is defined by subtracting twice the spacer width from the width of the gate opening.

Figure 6:
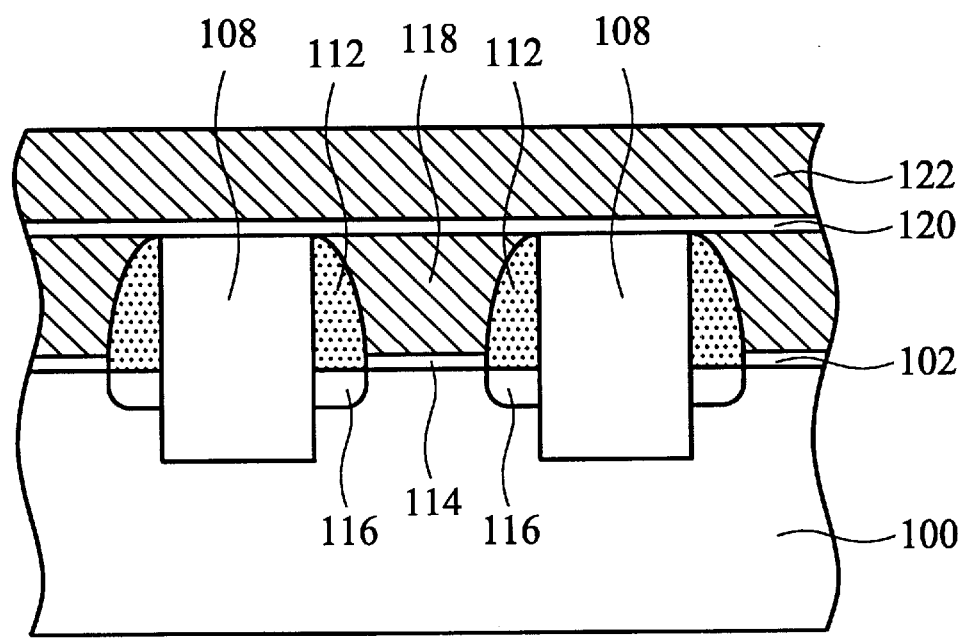

Next, as shown in FIG. 6, an inter-gate dielectric layer 120 and a second conductive layer 122 for serving as a control gate layer are sequentially formed over the coplanar surface of the floating gate 118 and the isolation oxides 108. The inter-gate dielectric layer 120 is typically composed of oxide/nitride/oxide (ONO), nitride/oxide (NO), or $Ta_2O_5$. The second conductive layer 122 is typically made of doped polysilicon or polycide. Finally, a masking and etching process is performed to define a control gate from the second conductive layer 122. Thus, a nonvolatile memory device with a reduced size floating gate and an increased coupling ratio is fabricated.

As shown in FIG. 6, the nonvolatile memory device according to the invention includes at least two isolation structures 108 protruding above a semiconductor substrate 100. Two dielectric spacers 112, preferably doped spacers, are disposed on a pair of opposing sidewalls of the two isolation structures 108. The two dielectric spacers 112 are spaced from one another at a distance that defines a gate width therebetween which is beyond lithography limit. A tunnel dielectric 144 and a floating gate 118 are provided on the substrate and confined between the two dielectric spacers 112. The floating gate 118 has a smaller bottom surface area relative to its top surface area and has a surface substantially coplanar with a surface of the isolation structures 108. On the coplanar surface, an inter-gate dielectric 120 and a control gate 122 are provided. Optionally, a lightly doped region 116 is provided beside the floating gate 118 and within the substrate 100.

Accordingly, the present invention provides a technique, including a device and method, for a reduced size floating gate for a nonvolatile memory device. This reduced floating gate has gate width beyond lithography limit which reduces the capacitance between the floating gate and the substrate and results in an increased capacitive coupling ratio.

While the invention has been particularly shown and described with reference to the preferred embodiment thereof, it will be understood by those skilled in the art that various changes in form and details may be made without departing from the spirit and scope of the invention.

What is claimed is:

1. A method for forming a nonvolatile memory device, comprising the steps of:

forming two isolation structures protruding above a substrate;

forming two dielectric spacers respectively in the angles formed by each opposing sidewall of said two isolation structures and said substrate;

forming a tunnel dielectric layer and a floating gate layer on said substrate and confined between said two dielectric spacers on said substrate; and sequentially forming an inter-gate dielectric layer and a control gate layer over said substrate.

2. The method as claimed in claim 1, wherein said dielectric spacers have a width between about 100 and 2000 Å.

3. The method as claimed in claim 1, wherein said dielectric spacers are formed of silicon oxide or silicon nitride.

4. The method as claimed in claim 1, wherein said sidewall spacer are formed of doped silicon oxide or doped silicon nitride.

5. The method as claimed in claim 1, wherein said floating gate is formed of a material selected from the group consisting of doped polysilicon, doped amorphous silicon, and metal.

6. The method as claimed in claim 1, wherein said floating gate is formed of doped polysilicon.

7. The method as claimed in claim 1, wherein said control gate is formed of a material selected from the group consisting of doped polysilicon and polycide.

8. The method as claimed in claim 1, wherein said floating gate is formed of doped polysilicon.

9. The method as claimed in claim 1, further comprising forming a lightly doped region beside said floating gate and within said substrate.

10. The method as claimed in claim 1, wherein said floating gate has a smaller bottom surface area relative to its top surface area.

11. A method for forming a nonvolatile memory device, comprising the steps of:

forming a mask layer on a semiconductor substrate;

patterning said mask layer and said substrate to form trenches in said substrate;

filling said trenches with isolation oxides that protrude above said substrate;

removing said mask layer to leave a gate opening in between said isolation oxides;

forming two dielectric spacers on a pair of opposing sidewalls of said isolation oxides, said two dielectric spacers being spaced from one another at a distance that defines a gate width therebetween;

forming a tunnel dielectric layer on said substrate and between said two dielectric spacers;

forming a floating gate layer on said tunnel dielectric layer and completely filling said gate opening;

planarizing said floating gate layer to form a surface substantially coplanar with a surface of said isolation structures; and sequentially forming an inter-gate dielectric layer and a control gate layer on said coplanar surfaces of said floating gate and said two isolation structures.

12. The method as claimed in claim 11, wherein said mask layer comprises a stack of a pad oxide layer and a silicon nitride layer.

13. The method as claimed in claim 11, wherein said mask layer has a thickness between about 200 and 3500 Å.

14. The method as claimed in claim 11, wherein said dielectric spacers have a width between about 100 and 2000 Å.

15. The method as claimed in claim 11, wherein said dielectric spacers are formed of silicon oxide or silicon nitride.

16. The method as claimed in claim 11, wherein said sidewall spacers are formed of doped silicon oxide or doped silicon nitride.

17. The method as claimed in claim 11, further comprising forming a lighted dope region beside said floating gate and within said substrate.

18. The method as claimed in claim 11, wherein said floating gate has a smaller bottom surface area relative to its top surface area.

19. The method as claimed in claim 11, wherein said two sidewall spacers defines a gate width that is beyond lithography limit.

20. A method for forming a nonvolatile memory device, comprising the steps of:

forming a pad oxide layer and a silicon nitride layer on a semiconductor substrate;

patterning said silicon nitride layer, said pad oxide layer and said substrate to form trenches in said substrate;

filling said trenches with isolation oxides that protrude above said substrate;

removing said silicon nitride layer to leave a gate opening between said isolation oxides;

forming two doped dielectric spacers on a pair of opposing sidewalls of said isolation oxides, said two doped dielectric spacers being spaced from one another at a distance that defines a gate width therebetween;

removing said pad oxide layer;

forming a tunnel dielectric layer between said two doped dielectric spacers and concurrently forming a lighted doped region beneath said two doped dielectric spacers by thermal oxidation;

forming a floating gate layer on said tunnel dielectric layer and completely filling said gate opening;

planarizing said floating gate layer to form a surface substantially coplanar with a surface of said isolation structures; and sequentially forming an inter-gate dielectric layer and a control gate layer on said coplanar surfaces of said floating gate and said two isolation structures.

* * * * *